United States Patent
Liu et al.

(10) Patent No.: US 9,054,288 B2
(45) Date of Patent: *Jun. 9, 2015

(54) LIGHT EMITTING DIODE WITH HIGH LIGHT EXTRACTION EFFICIENCY AND METHOD FOR MANUFACTURING THE SAME

(71) Applicants: Chih-Jung Liu, Hsinchu (TW); Tzu-Chien Hung, Hsinchu (TW)

(72) Inventors: Chih-Jung Liu, Hsinchu (TW); Tzu-Chien Hung, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/662,525

(22) Filed: Oct. 28, 2012

(65) Prior Publication Data

US 2013/0256702 A1 Oct. 3, 2013

(30) Foreign Application Priority Data

Mar. 30, 2012 (CN) .......................... 2012 1 0895332

(51) Int. Cl.
| | |
|---|---|
| H01L 33/00 | (2010.01) |
| H01L 33/60 | (2010.01) |
| H01L 33/20 | (2010.01) |
| H01L 33/62 | (2010.01) |
| H01L 33/38 | (2010.01) |
| H01L 33/42 | (2010.01) |
| H01L 33/54 | (2010.01) |
| H01L 33/44 | (2010.01) |

(52) U.S. Cl.
CPC ................ *H01L 33/60* (2013.01); *H01L 33/20* (2013.01); *H01L 33/54* (2013.01); *H01L 33/62* (2013.01); *H01L 33/38* (2013.01); *H01L 33/44* (2013.01); *H01L 33/42* (2013.01); *H01L 2933/0091* (2013.01)

(58) Field of Classification Search
CPC . H01L 2933/0091; H01L 33/38; H01L 33/42; H01L 33/44; H01L 33/60; H01L 33/20; H01L 33/62; H01L 33/54
USPC .............. 257/98–99, 76, 43, 103; 438/29, 46, 438/694; 313/498
See application file for complete search history.

(56) References Cited

U.S. PATENT DOCUMENTS

| | | | |
|---|---|---|---|
| 6,603,152 B2 * | 8/2003 | Song et al. ...................... | 257/99 |
| 2004/0041164 A1 * | 3/2004 | Thibeault et al. ............... | 257/98 |
| 2005/0122033 A1 * | 6/2005 | Chen et al. ..................... | 313/498 |
| 2005/0145862 A1 | 7/2005 | Kim | |

(Continued)

FOREIGN PATENT DOCUMENTS

| | | |
|---|---|---|
| JP | 2000-216431 | 8/2000 |
| JP | 2007-165515 | 6/2007 |
| JP | 2008-198876 | 8/2008 |

*Primary Examiner* — Mohammed Shamsuzzaman
(74) *Attorney, Agent, or Firm* — Novak Druce Connolly Bove + Quigg LLP

(57) ABSTRACT

A light emitting diode includes a light emitting structure, a transparent conductive layer and a transparent protecting layer formed in sequence. A plurality of holes are defined in the transparent protecting layer to expose the transparent conductive layer out of the transparent protecting layer. A plurality of micro-structures are formed on a top surface of the transparent conductive layer in the holes. The microstructures refract light emitted from the light emitting structure and travelling through the transparent conductive layer.

10 Claims, 5 Drawing Sheets

(56) References Cited

U.S. PATENT DOCUMENTS

| | | | |
|---|---|---|---|
| 2005/0277218 A1* | 12/2005 | Nakajo et al. | 438/46 |
| 2006/0270074 A1 | 11/2006 | Kim | |
| 2007/0018183 A1 | 1/2007 | Denbaars | |
| 2009/0045435 A1* | 2/2009 | Yao et al. | 257/103 |
| 2009/0052159 A1 | 2/2009 | Abe | |
| 2009/0309119 A1* | 12/2009 | Shinohara et al. | 257/99 |
| 2010/0052000 A1* | 3/2010 | Ko et al. | 257/98 |
| 2010/0133529 A1* | 6/2010 | Taraschi et al. | 257/43 |
| 2010/0273331 A1* | 10/2010 | Chan et al. | 438/694 |
| 2010/0327300 A1* | 12/2010 | Epler et al. | 257/98 |
| 2011/0097832 A1* | 4/2011 | Fan et al. | 438/29 |
| 2013/0001615 A1* | 1/2013 | Kim | 257/98 |
| 2013/0049006 A1* | 2/2013 | Hu | 257/76 |

* cited by examiner

LIGHT EMITTING DIODE WITH HIGH LIGHT EXTRACTION EFFICIENCY AND METHOD FOR MANUFACTURING THE SAME

BACKGROUND

1. Technical Field

The disclosure relates to light emitting diodes, and particularly to a light emitting diode with a transparent protecting layer and a transparent conductive layer whose structures are modified to thereby increase light extraction efficiency of the light emitting diode, and a method for manufacturing the light emitting diode.

2. Description of the Related Art

A conventional light emitting diode (LED) includes a substrate, a light emitting structure having an N-type semiconductor layer, an active layer and a P-type semiconductor layer formed on the substrate in sequence, and two electrodes (i.e., N-type and P-type electrodes) respectively connected to the N-type and P-type semiconductor layers. There are several factors affecting the light extraction efficiency of the light emitting diode, such as material of the semiconductor layer, construction of the light emitting structure, transparency of the light emitting diode, or total reflection of the light radiated from the light emitting structure.

Generally, to achieve a homogenous current distribution in the semiconductor layers without decreasing light extraction efficiency thereof, a transparent indium tin oxide (ITO) layer is formed between the P-type electrode and the P-type semiconductor layer. A transparent protecting layer is further formed on the transparent conductive layer to protect the light emitting diode. However, in fact, both the transparent conductive layer and the transparent protecting layer will result in total reflection when the light exits therefrom, thereby decreasing light extraction efficiency of the light emitting diode.

Therefore, it is desirable to provide a light emitting diode and a method for manufacturing a light emitting diode with high light extraction efficiency.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting diode and a method for manufacturing the light emitting diode. Moreover, in the drawings, like reference numerals designate corresponding parts throughout the views.

DETAILED DESCRIPTION

Figure 1:
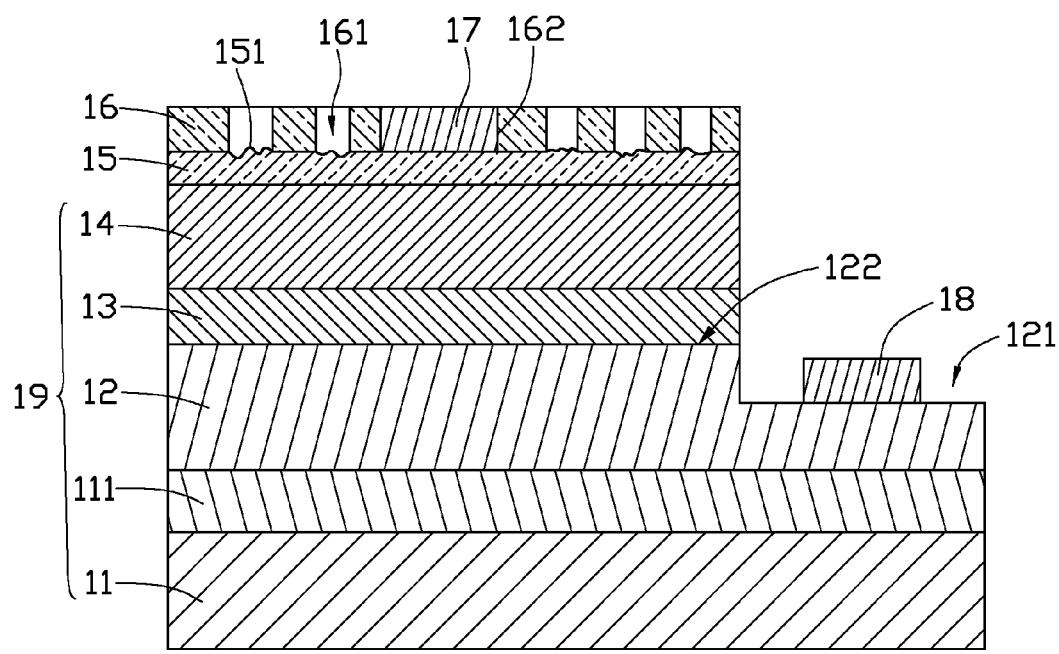
FIG. 1 is a cross-sectional view of a light emitting diode in accordance with a first embodiment of the present disclosure.

Referring to FIG. 1, a light emitting diode 10 in accordance with a first exemplary embodiment is provided. The light emitting diode 10 includes a light emitting structure 19, a transparent conductive layer 15, a transparent protecting layer 16, a first electrode 17 and a second electrode 18 having an opposite polarity with respect to the first electrode 17. The light emitting structure 19 includes a substrate 11, a first-type semiconductor layer 12, an active layer 13, and a second-type semiconductor layer 14. The transparent conductive layer 15 is transparent to light and conductive to electricity.

The substrate 11 is dielectric. The substrate 11 can be sapphire ($\alpha$-$Al_2O_3$) substrate, silicon carbide (SiC) substrate, etc.

The first-type semiconductor layer 12, the active layer 13 and the second-type semiconductor layer 14 are formed on the substrate 11 in sequence, from bottom to top. Before formation of the first-type semiconductor 12, a buffer layer 111 which can lessen the degree of lattice mismatch between the first-type semiconductor 12 and the substrate 11 is formed on the substrate 11. Accordingly, the first-type semiconductor 12 is formed on the buffer layer 111. The buffer layer 111 is made of GaN or AlN. The buffer layer 111 improves the easiness of growth of the first-type semiconductor layer 12 on the substrate 11. The active layer 13 is sandwiched between the first-type semiconductor layer 12 and the second-type semiconductor layer 14. The first-type semiconductor layer 12, the active layer 13 and the second-type semiconductor layer 14 can be made of III-V or II-VI compound semiconductors. The first-type semiconductor layer 12 and the second-type semiconductor layer 14 are doped with different materials. In this embodiment, the first-type semiconductor layer 12 is N-type doped, and the second-type semiconductor layer 14 is P-type doped. In an alternative embodiment, the first-type semiconductor layer 12 can be P-type doped, and the second-type semiconductor layer 14 can be N-type doped. Further alternatively the buffer layer 111. can be omitted.

Figure 2:
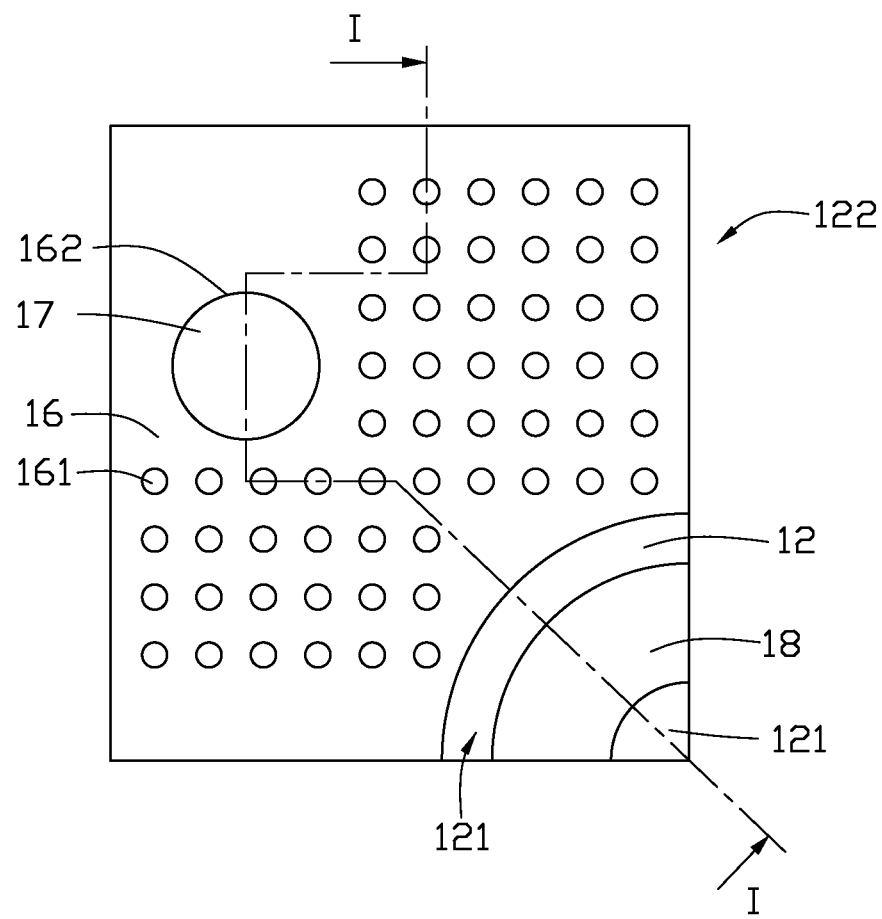
FIG. 2 is a top view of the light emitting diode of FIG. 1.

Also referring to FIG. 2, the first-type semiconductor layer 12 which is formed on the buffer layer 111 has an exposed first area 121 and a covered second area 122 farthest away from the substrate 11. The first area 121 is uncovered by the active layer 13 and the second-type semiconductor layer 14. The second area 122 is covered by the active layer 13 and the second-type semiconductor layer 14. In this embodiment, the first area 121 is substantially triangle-shaped and positioned at a corner of the first-type semiconductor 12. In addition, the shape and position of the first area 121 can be changed. For example, the first area 121 can be an annular area surrounding the second area 122.

The active layer 13 can be a single quantum well (SQW) structure or a multiple quantum well (MQW) structure.

The transparent conductive layer 15 is formed on the second-semiconductor layer 14. The transparent conductive layer 15 can be made of ITO (indium tin oxide) and accordingly is an ITO layer.

The first electrode 17 is formed on the transparent conductive layer 15. The second electrode 18 is formed on the first area 121 of the first-type semiconductor layer 12. The first electrode 17 has a same polarity as the second-type semiconductor layer 14, and the second electrode 18 has a same polarity as the first-type semiconductor layer 12.

A through hole 162 is defined in the transparent protecting layer 16. The first electrode 17 is formed in the through hole 162. A bottom of the first electrode 17 is attached to the transparent conductive layer 15 and a top of the first electrode 17 is exposed out of the transparent protecting layer 16. The transparent conductive layer 15 is protected by the transparent protecting layer 16 from being contaminated, without blocking the light radiated from the light emitting structure 19, when the light emitting diode 10 is used. The first electrode 17 is exposed out of the transparent protecting layer 16 to have capacity to be connected to a circuit board (not illustrated) via wire bonding. The transparent protecting layer 16 is made of electrically insulating materials, such as transparent silica ($SiO_2$), silicon carbide (SiN), diamond like carbon film and so on, which can further protect the light emitting diode 10 from electrical interference and damage. In alternative embodiments, the transparent protecting layer 16 can further cover lateral and bottom sides of the light emitting diode 10.

Figure 3:
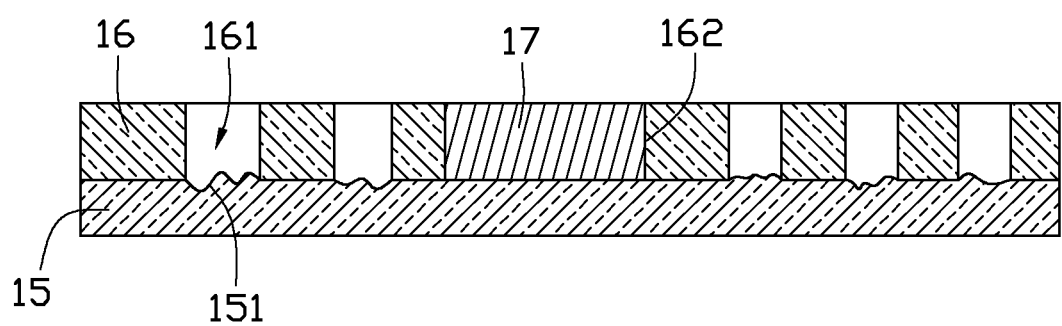
FIG. 3 is an enlarged view of a transparent conductive layer, a transparent protecting layer and a first electrode of the light emitting diode of FIG. 1.

Referring to FIGS. 2 and 3, a plurality of holes 161 are defined in the transparent protecting layer 16. The transparent conductive layer 15 below the plurality of hoes 161 of the transparent protecting layer 16 is exposed to air. In this embodiment, an area of an opening of each hole 161 is greater than 8 square microns ($\mu m^2$). A plurality of micro-structures 151 are formed on a top surface of the transparent conductive layer 15 exposed through the holes 161. The micro-structures 151 each can be grain-shaped, trapezoid, inverted trapezoid, elliptical, semicircular, rectangular, triangular or inverted triangular. In this embodiment, the micro-structures 151 each are grain-shaped and has a volume smaller than 1 cubic micrometer ($\mu m^3$). Light radiated from the active layer 13 will travel upwardly and be refracted towards different directions when passing through the micro-structures 151, thereby avoiding total reflection and increasing the light extraction efficiency and luminance of the light emitting diode 10. According to the present disclosure, a part of the transparent conductive layer 15 located at the bottoms of the holes 161 is coarsened to increase the light extraction efficiency without decreasing the electrical property thereof. Further, the transparent protecting layer 16 functions not only as a protector for the light emitting diode 10, but also as a mask in a process of forming the micro-structures 151 on the transparent conductive layer 15.

Figure 4:
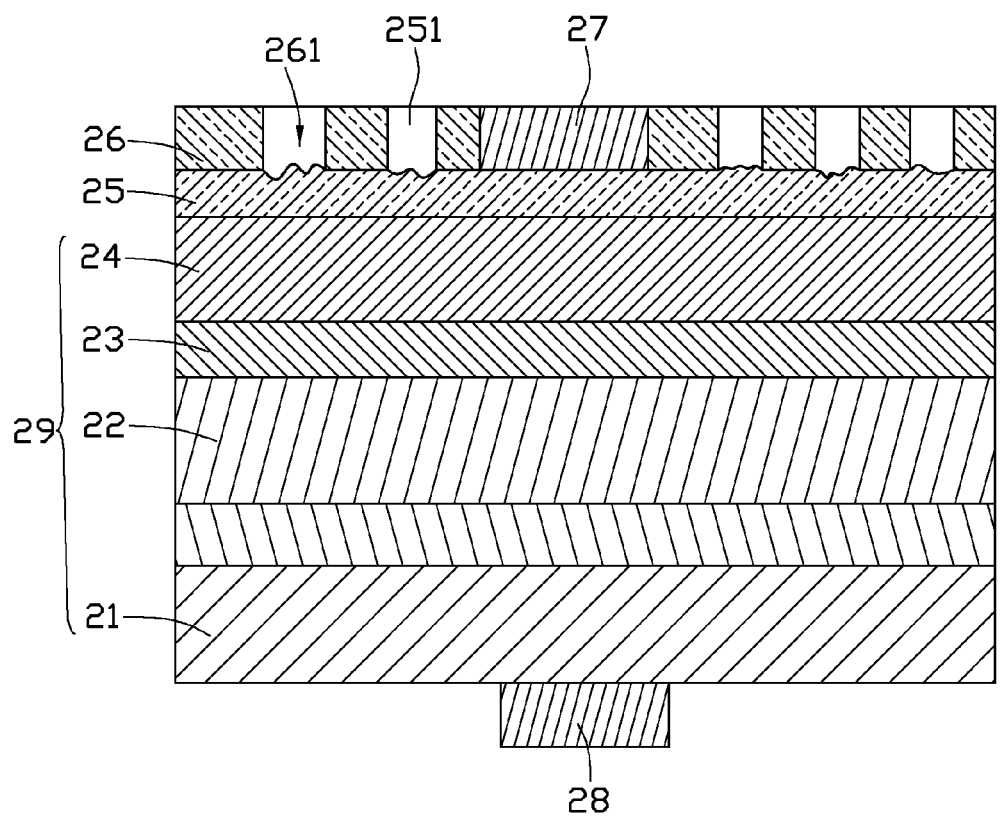
FIG. 4 is a cross-sectional view of a light emitting diode in accordance with a second embodiment of the present disclosure.

Referring to FIG. 4, a light emitting diode 20 in accordance with a second exemplary embodiment is provided. The differences between the light emitting diode 20 and the light emitting diode 10 are described below. The light emitting diode 20 is a vertical structure. The light emitting diode 20 includes a light emitting structure 29, a transparent conductive layer 25, a transparent protecting layer 26, a first electrode 27 and a second electrode 28 having an opposite polarity with respect to the first electrode 27. The light emitting structure 29 includes a substrate 21, a first-type semiconductor layer 22, an active layer 23 and a second-type semiconductor layer 24. The first and second electrodes 27, 28 are positioned at different sides of the light emitting diode 20. The first electrode 27 is positioned by one side of the transparent protecting layer 26. The second electrode 28 is positioned by one side of the substrate 21, away from the first electrode 27. The active layer 23 covers a top surface of the first-type semiconductor layer 22 totally.

Figure 5:
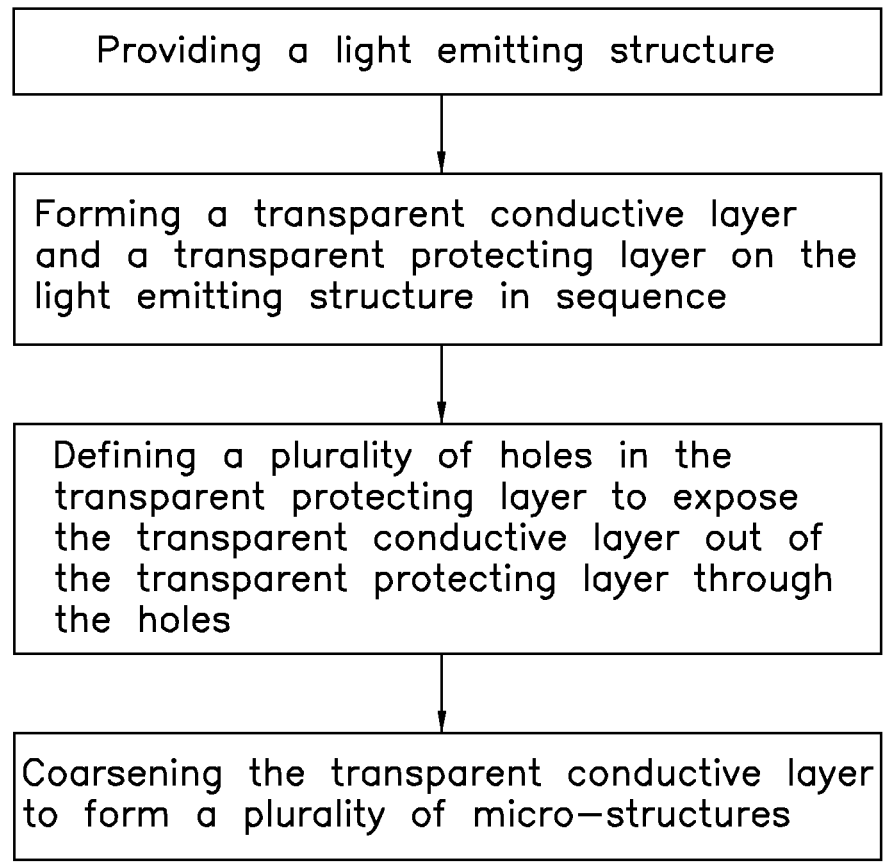
FIG. 5 is a flow chart of a method showing steps of a method for manufacturing the light emitting diode of FIG. 1.

FIG. 5 shows a flow chart of a method for manufacturing the light emitting diode. The method for manufacturing the light emitting diodes includes the following steps:

step 1, providing a light emitting structure 19;

step 2, forming a transparent conductive layer 15 and a transparent protecting layer 16 on the light emitting structure 19 in sequence;

step 3, defining a plurality of holes 161 in the transparent protecting layer 16 to expose the transparent conductive layer 15 out of the transparent protecting layer 16 through the holes 161;

step 4, coarsening the transparent conductive layer 15 to form a plurality of micro-structures 151 in the holes 161.

In step 1, the light emitting structure 19 includes a substrate 11, a first-type semiconductor layer 12, an active layer 13, and a second-type semiconductor layer 14. The first-type semiconductor layer 12 is N-type doped, and the second-type semiconductor layer 14 is P-type doped. In an alternative embodiment, the first-type semiconductor layer 12 can be P-type doped, and the second-type semiconductor layer 14 can be N-type doped.

In step 4, the holes 161 defined in the transparent protecting layer 16 can be made by photolithography or etching process. The micro-structures 151 can be made by etching or ion bombardment process. Chemical solution, such as hydrochloric acid, sulfuric acid, oxalic acid, phosphoric acid or hydrofluoric acid, can be used as corrosive liquid in the etching process. A pattern and shape of the micro-structures 511 can be adjusted by different masks.

The method for manufacturing the light emitting diode can further include a step of forming electrodes after step 4, which includes following steps:

firstly, defining a through hole 162 in the transparent protecting layer 16;

secondly, forming a first electrode 17 in the through hole 162;

thirdly, forming a second electrode 18 on the first-type semiconductor layer 12.

The through hole 162 can be made by etching to expose the transparent conductive layer 15 out of the through hole 162. A bottom of the first electrode 17 is attached to the transparent conductive layer 15. A top of the first electrode 17 is exposed out of transparent protecting layer 16 for wire bonding.

In this present disclosure, light radiated from the active layer 13 will travel upwardly and be refracted towards different directions when passing through the micro-structures 151, thereby avoiding total reflection and increasing the light extraction efficiency and luminance of the light emitting diode 10. A part of the transparent conductive layer 15 at the bottoms of the holes 161 is coarsened to increase the light extraction efficiency without decreasing the electrical property thereof. Further, the transparent protecting layer 16 functions not only as a protector for the light emitting diode 10, but also as a mask in a process of forming the micro-structures 151 on the transparent conductive layer 15.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode, comprising:
a light emitting structure;
a transparent conductive layer formed on the light emitting structure;
a transparent protecting layer formed on the transparent conductive layer, a plurality of holes being defined in the transparent protecting layer to expose the transparent conductive layer out of the transparent protecting layer, a plurality of micro-structures being formed on a top surface of the transparent conductive layer only in each of the plurality of holes, the plurality of micro-structures refracting light from the light emitting structure and travelling through the transparent conductive layer; and
a first electrode formed on the transparent conductive layer;
wherein a face of the first electrode away from the transparent conductive layer is exposed through the transparent protecting layer, and the face of the first electrode is coplanar to a top surface of the transparent protecting layer; and wherein the transparent protecting layer surrounds the first electrode, a through hole is defined in the transparent protecting layer, a diameter of the through hole is larger than that of each of the plurality of holes, and the first electrode is formed in the through hole.

2. The light emitting diode of claim 1, wherein the transparent protecting layer is made of electrically insulating material.

3. The light emitting diode of claim 1, wherein each of the plurality of micro-structures is grain-shaped having a volume smaller than 1 cubic micrometer.

4. The light emitting diode of claim 1, wherein an area of each of the plurality of holes is greater than 8 square microns.

5. The light emitting diode of claim 1, wherein the light emitting structure comprises a substrate, a first-type semiconductor layer, an active layer, and a second-type semiconductor layer formed on the substrate in sequence.

6. The light emitting diode of claim 5, wherein the first-type semiconductor layer is an N-type semiconductor layer, and the second-type semiconductor layer is a P-type semiconductor layer.

7. The light emitting diode of claim 6, wherein the first-type semiconductor layer comprises a first area and a second area, the first area being exposed outside, the second area being covered by the active layer.

8. The light emitting diode of claim 7, further comprising a second electrode, wherein the second electrode is formed on the first area of the first-type semiconductor layer.

9. A light emitting diode, comprising:
a light emitting structure;
a transparent conductive layer formed on the light emitting structure; and
a transparent protecting layer formed on the transparent conductive layer, a plurality of holes and a through hole being defined in the transparent protecting layer to expose the transparent conductive layer out of the transparent protecting layer, the plurality of holes surrounding the through hole, a first electrode being formed in the through hole, a plurality of micro-structures being formed on a top surface of the transparent conductive layer only in each of the plurality of holes;

wherein a face of the first electrode away from the transparent conductive layer is exposed through the transparent protecting layer, and the face of the first electrode is coplanar to a top surface of the transparent protecting layer; and wherein the transparent protecting layer surrounds the first electrode, an area of each of the plurality of holes is greater than 8 square microns, and an area of the through hole is larger than that of each of the plurality of holes.

10. The light emitting diode of claim 9, wherein each of the plurality of micro-structures is grain-shaped having a volume smaller than 1 cubic micrometer.

* * * * *